(12) United States Patent
Kameda et al.

(10) Patent No.: US 10,629,408 B2
(45) Date of Patent: Apr. 21, 2020

(54) CHARGED PARTICLE BEAM DEVICE

(71) Applicant: Hitachi High-Technologies Corporation, Minato-ku, Tokyo (JP)

(72) Inventors: Toshimasa Kameda, Tokyo (JP); Hiroya Ohta, Tokyo (JP); Kenji Tanimoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/311,492

(22) PCT Filed: Jul. 28, 2016

(86) PCT No.: PCT/JP2016/072101
§ 371 (c)(1),
(2) Date: Dec. 19, 2018

(87) PCT Pub. No.: WO2018/020624
PCT Pub. Date: Feb. 1, 2018

(65) Prior Publication Data
US 2019/0221400 A1 Jul. 18, 2019

(51) Int. Cl.
*H01J 37/244* (2006.01)
*H01J 37/28* (2006.01)
*H01J 37/147* (2006.01)

(52) U.S. Cl.
CPC ........ *H01J 37/244* (2013.01); *H01J 37/1474* (2013.01); *H01J 37/28* (2013.01);
(Continued)

(58) Field of Classification Search
CPC .. H01J 37/28; H01J 37/244; H01J 2237/2446; H01J 2237/24475; H01J 2237/28
See application file for complete search history.

(56) References Cited

U.S. PATENT DOCUMENTS 8,044,352 B2 * 10/2011 Hosoya ................. H01J 37/222
250/310
8,629,395 B2 1/2014 Morishita et al.
(Continued)

FOREIGN PATENT DOCUMENTS

JP 9-190793 A 7/1997
JP 9-320504 A 12/1997
(Continued)

OTHER PUBLICATIONS

International Search Report (PCT/ISA/210) issued in PCT Application No. PCT/JP2016/072101 dated Nov. 8, 2016 with English translation (five (5) pages).
(Continued)

*Primary Examiner* — Wyatt A Stoffa
(74) *Attorney, Agent, or Firm* — Crowell & Moring LLP

(57) ABSTRACT

The purpose of the present invention is to provide a charged particle beam device for detecting, with highly precise angular discrimination, charged particles emitted from a specimen. To achieve this purpose, proposed is a charged particle beam device provided with a scanning deflector for scanning on a specimen a charged particle beam emitted from a charged particle source, the charged particle beam device being provided with: a first detector for detecting charged particles obtained by scanning of the charged particle beam on a specimen, and a second detector placed between the first detector and the specimen, and supported so as to be able to move in the charged particle beam light axis direction.

10 Claims, 10 Drawing Sheets

(52) U.S. Cl.
CPC .................. *H01J 2237/2446* (2013.01); *H01J 2237/24475* (2013.01); *H01J 2237/28* (2013.01)

(56) References Cited

U.S. PATENT DOCUMENTS

| | | | |
|---|---|---|---|
| 2004/0183017 A1* | 9/2004 | Kamiya | H01J 37/244 250/311 |
| 2005/0098724 A1* | 5/2005 | Sullivan | H01J 37/28 250/310 |
| 2006/0186351 A1* | 8/2006 | Nishiyama | H01J 37/244 250/492.1 |
| 2009/0242792 A1* | 10/2009 | Hosoya | H01J 37/222 250/397 |
| 2014/0175279 A1 | 6/2014 | Agemura | |
| 2014/0284477 A1* | 9/2014 | Ebine | H01J 37/244 250/310 |
| 2014/0339436 A1* | 11/2014 | Aoshima | H01J 37/244 250/394 |
| 2016/0148782 A1* | 5/2016 | Agemura | H01J 37/244 250/310 |
| 2016/0307726 A1* | 10/2016 | Hatakeyama | G01N 23/2251 |
| 2017/0213696 A1* | 7/2017 | Litman | H01J 37/244 |

FOREIGN PATENT DOCUMENTS

| | | |
|---|---|---|
| JP | 11-273608 A | 10/1999 |
| JP | 2006-147430 A | 6/2006 |
| JP | 2009-181922 A | 8/2009 |
| JP | 2013-33671 A | 2/2013 |
| JP | 5386596 B2 | 1/2014 |
| JP | 2016-139513 A | 8/2016 |

OTHER PUBLICATIONS

Japanese-language Written Opinion (PCT/ISA/237) issued in PCT Application No. PCT/JP2016/072101 dated Nov. 8, 2016 (seven (7) pages).

* cited by examiner

[FIG. 1]
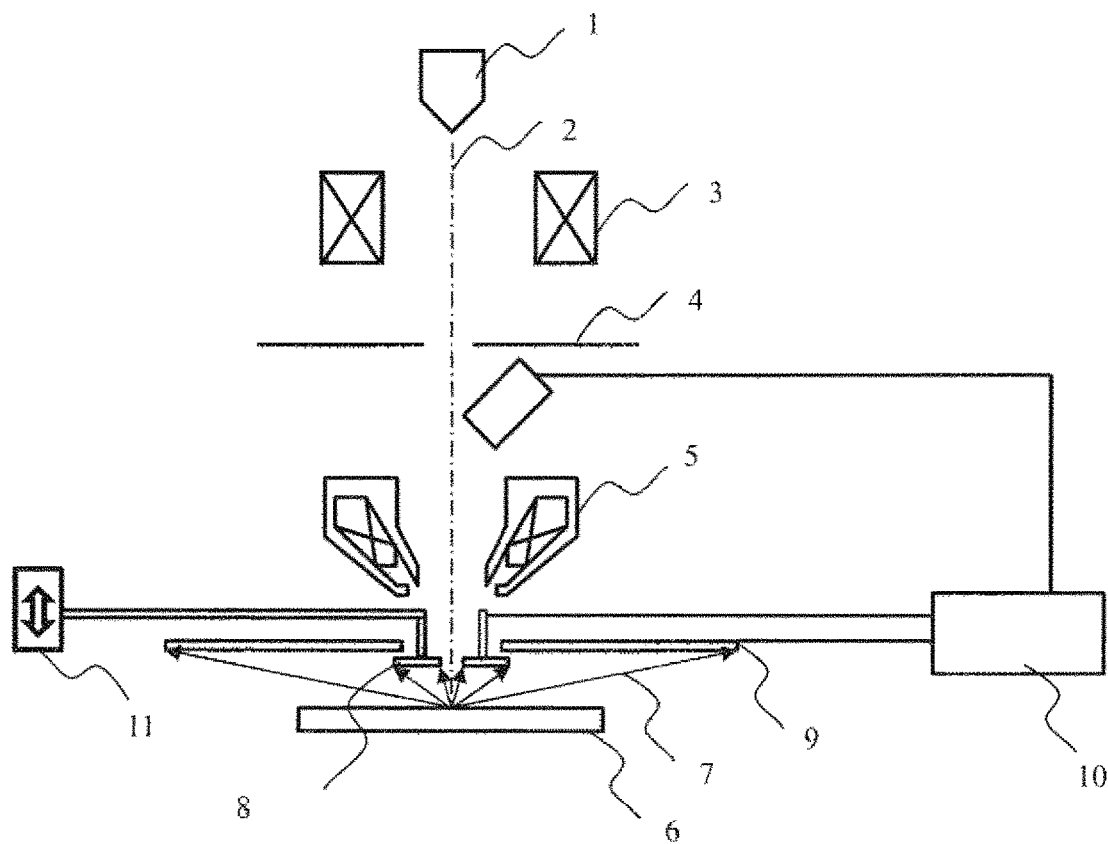
[FIG. 2]
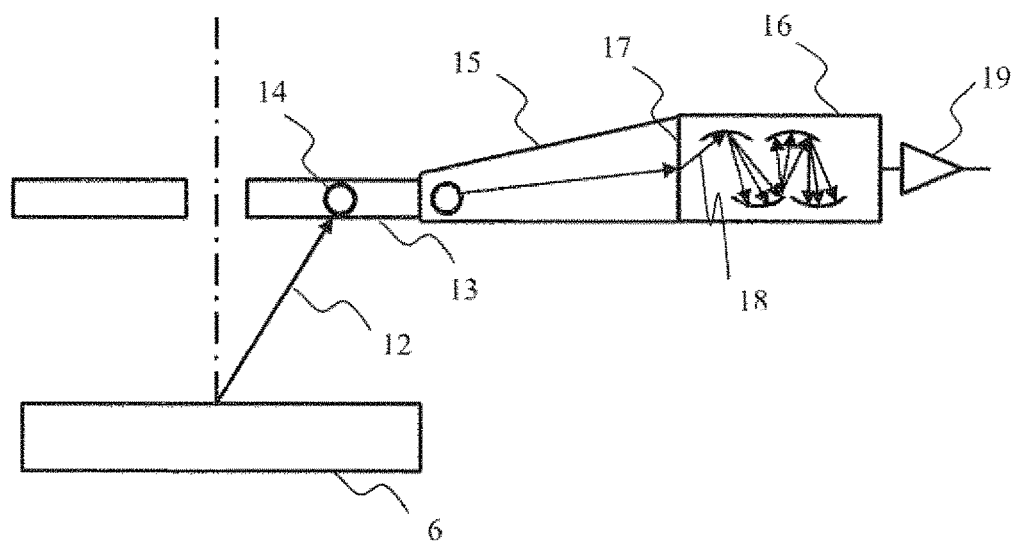

[FIG. 3]
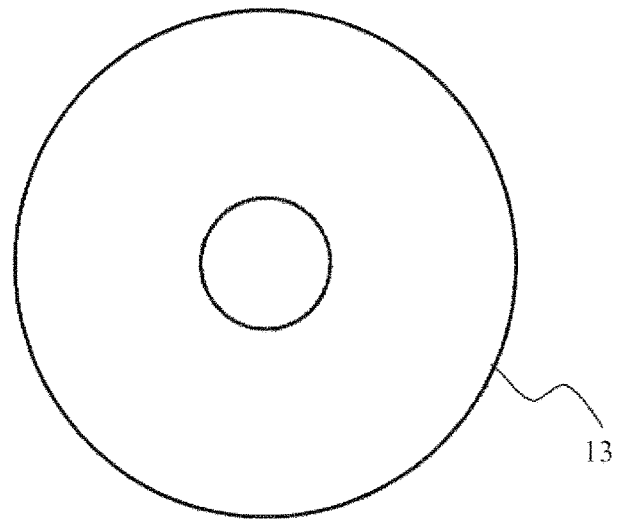
[FIG. 4]
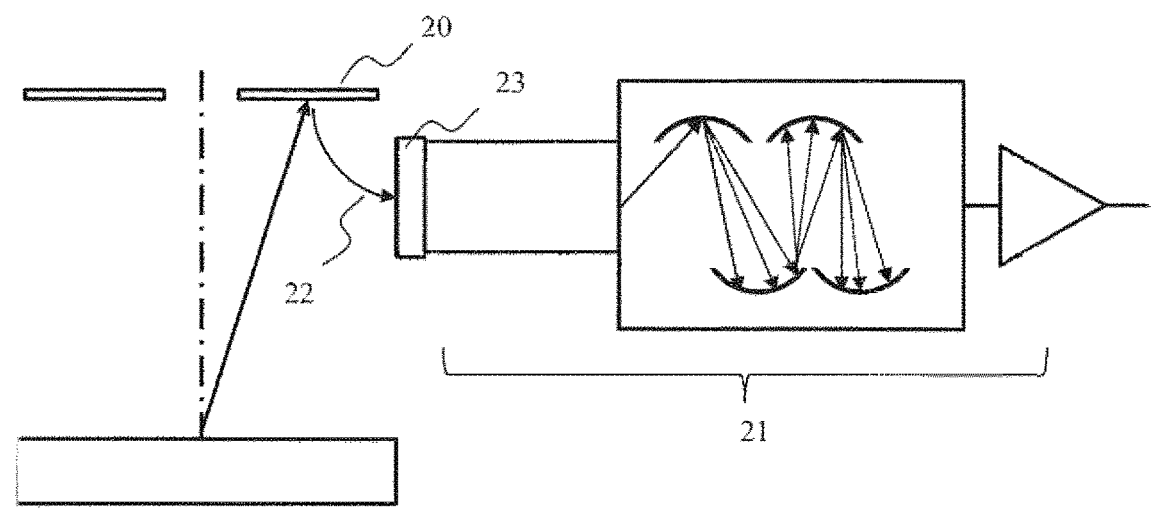

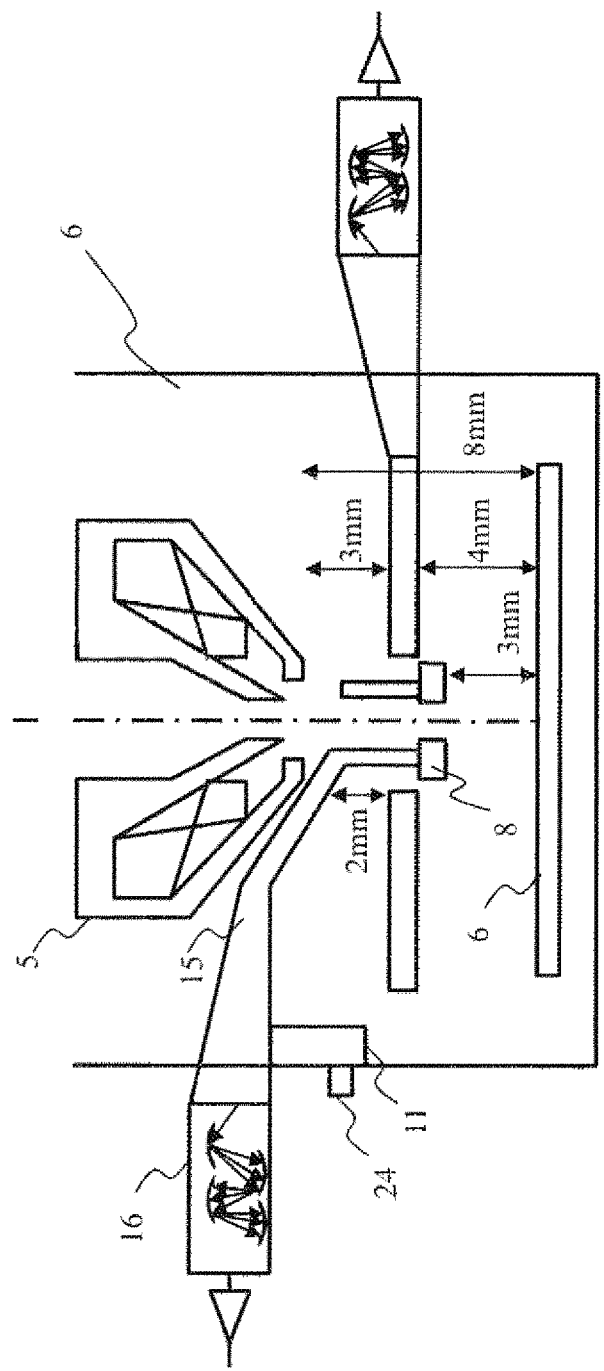
[FIG. 5]

[FIG. 6]
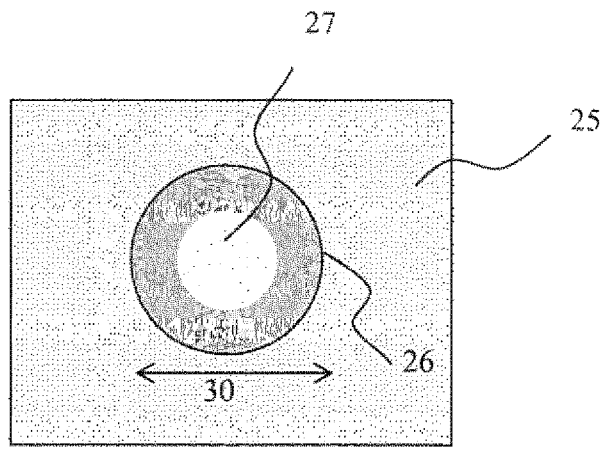
[FIG. 7]
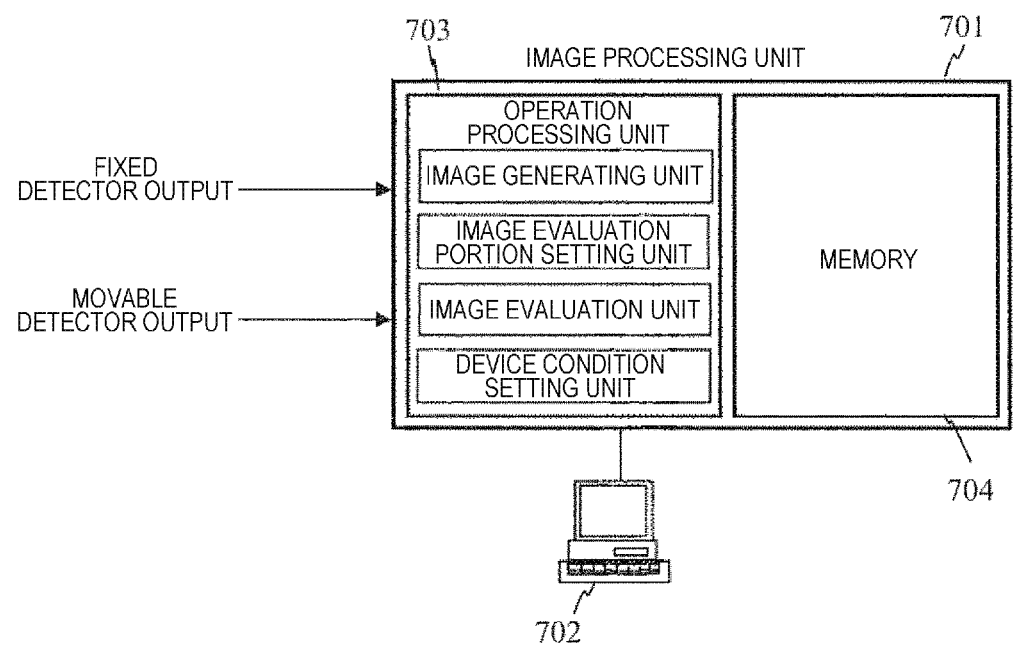

[FIG. 8]
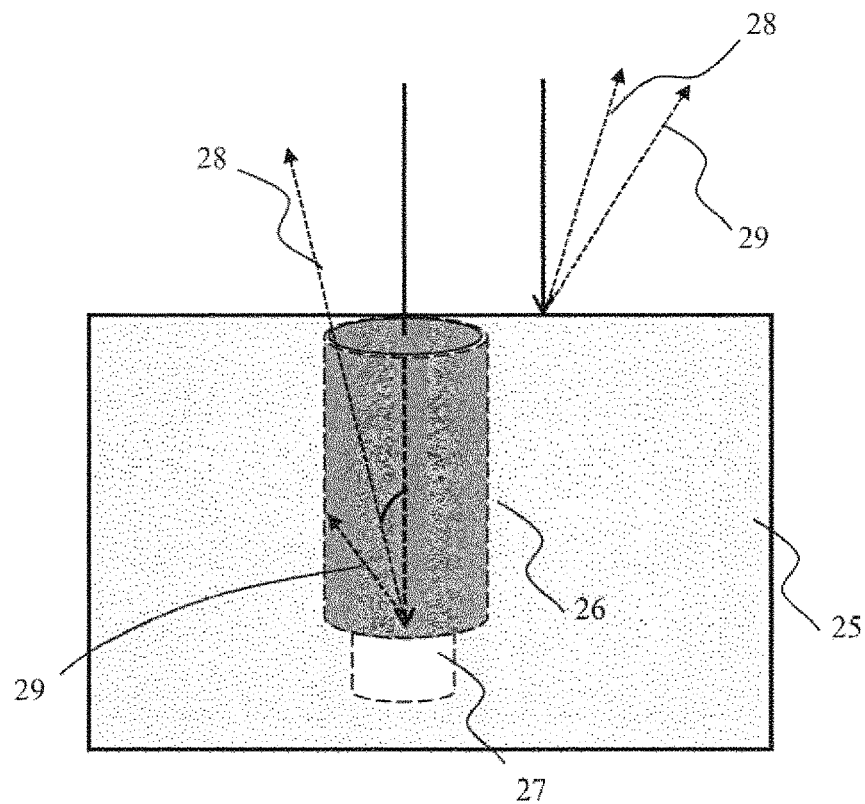
[FIG. 9]
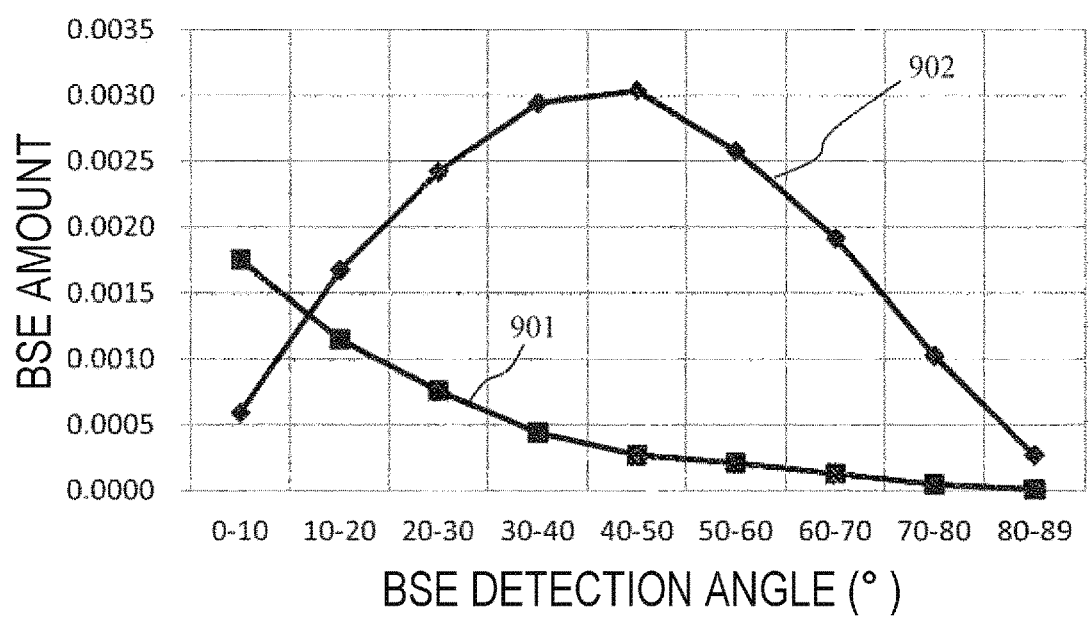

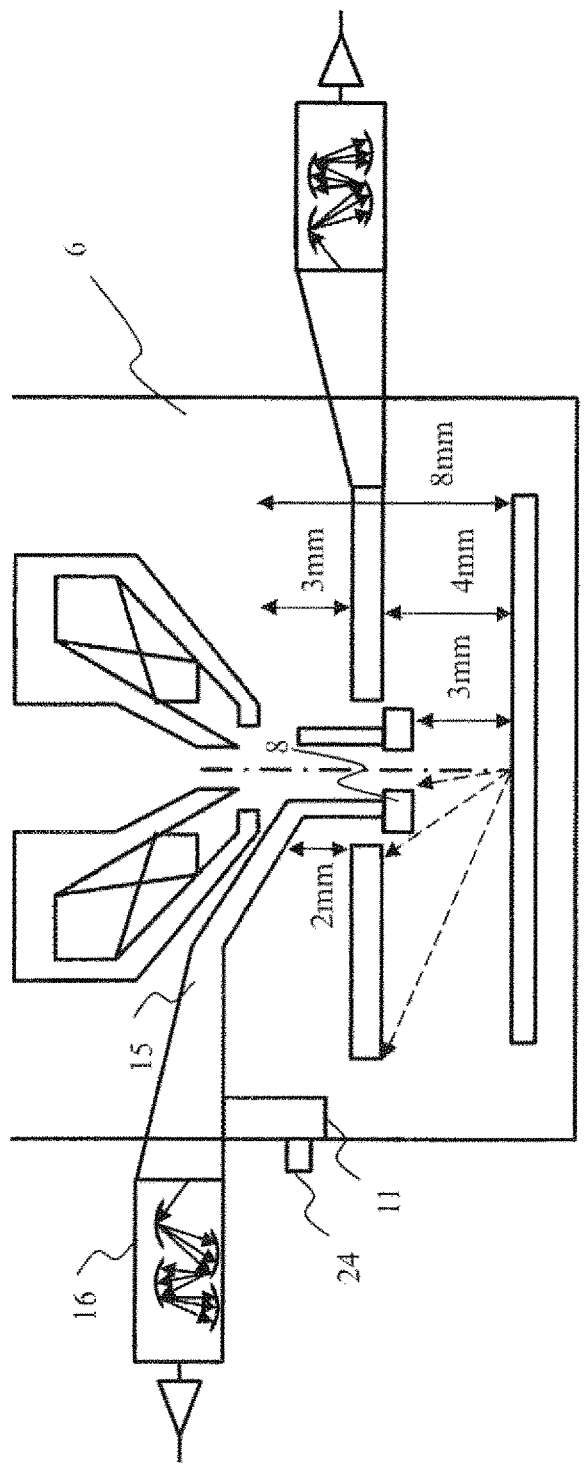
[FIG. 10]

[FIG. 11]
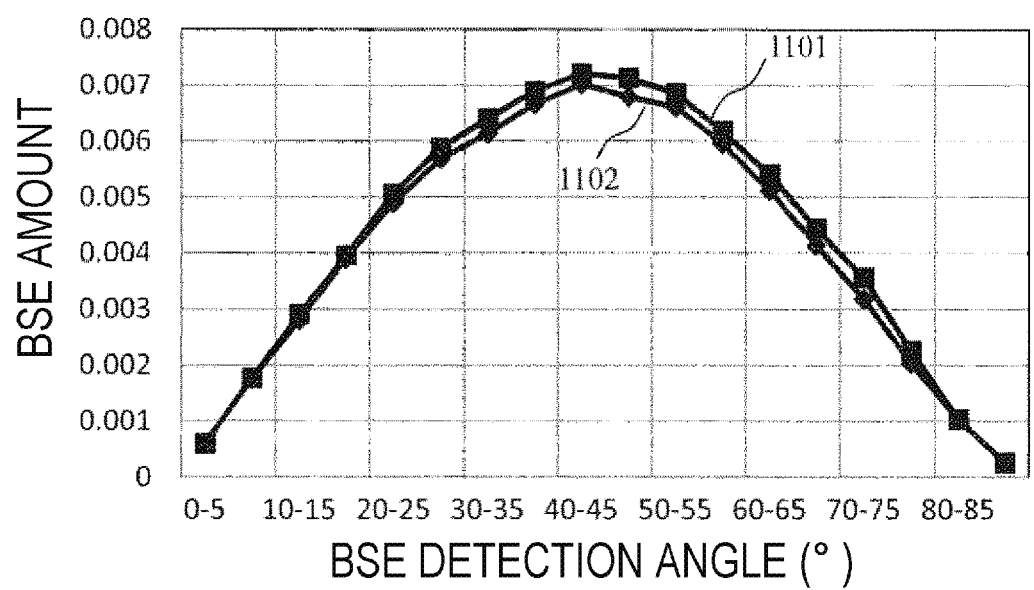

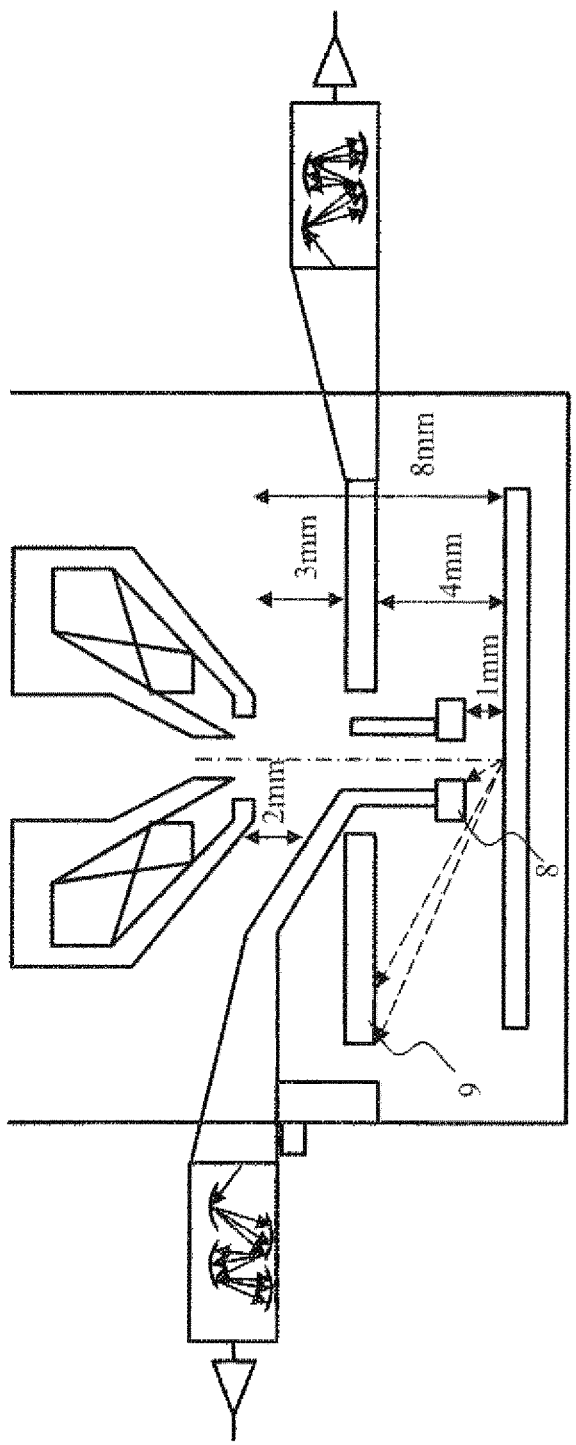

[FIG. 13]
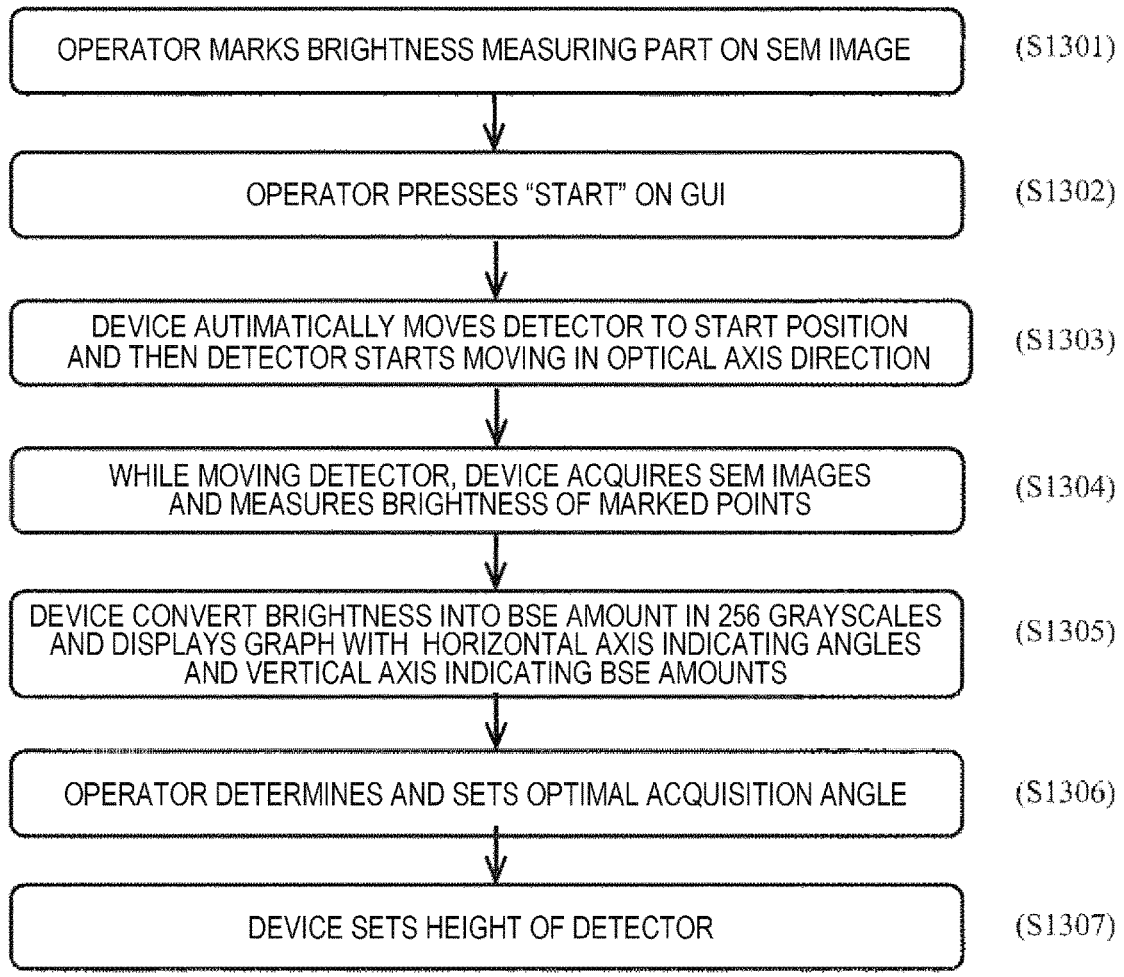

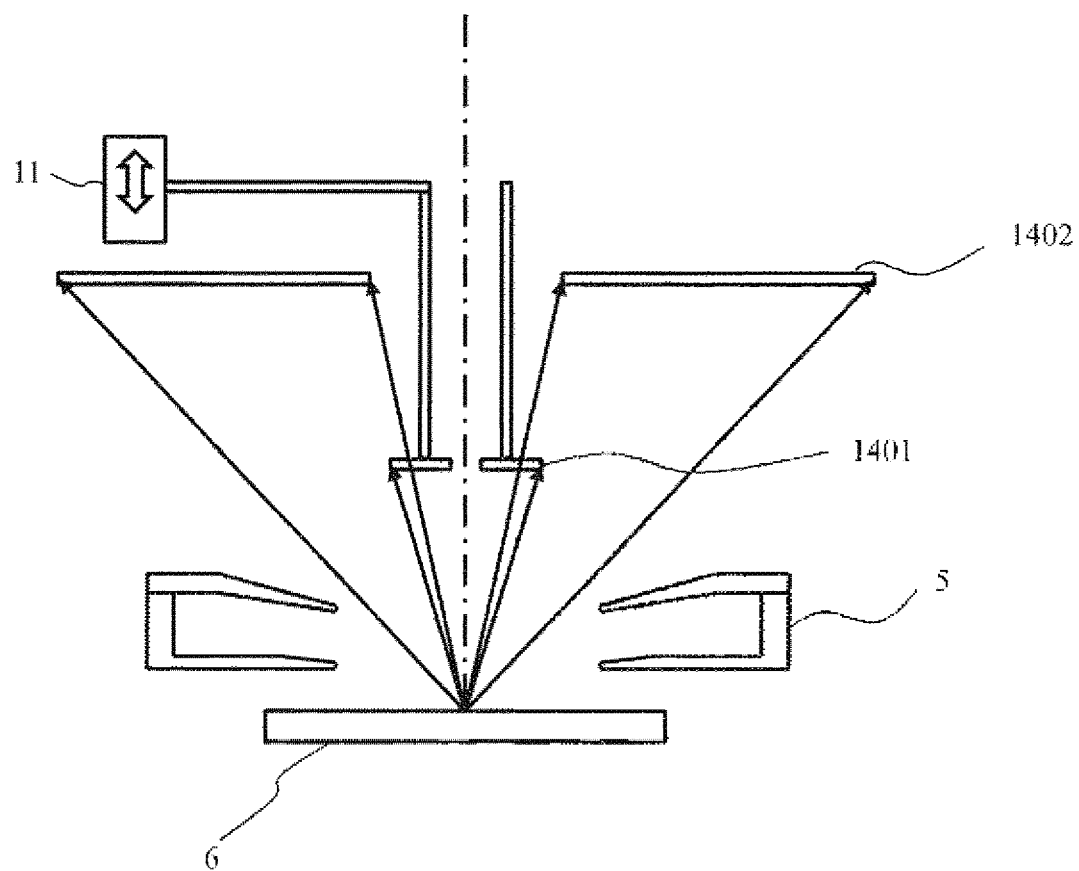
[FIG. 14]

CHARGED PARTICLE BEAM DEVICE

TECHNICAL FIELD

The present invention relates to a charged particle beam device, and particularly, to a charged particle beam device for detecting backscattered electrons emitted from a specimen based on irradiation of a charged particle beam to the specimen.

BACKGROUND ART

A charged particle beam device for acquiring specimen information on an irradiation position by irradiating charged particle on a specimen as a probe and detecting charged particles released from the irradiation position is widely known. For example, in a scanning electron microscope (SEM), an electron beam probe converged over a specimen is 2-dimensionally scanned and secondary electrons (SE) with a relatively low energy from 0 to 50 eV and backscattered electrons (BSE) having a wide distribution from 50 eV to the arrival energy of a primary electron beam are detected and imaged. It is generally known that different information is acquired for SE and BSE based on ranges of energy to be detected (energy discrimination).

For example, SE of several eV reflects information on a specimen surface and unevenness, and SE of higher energy reflects information on the interior of a specimen. Also, potential information on the specimen surface may be reflected. BSE reflects specimen composition information and crystallinity information and information on a deeper level of the interior of a specimen than SE.

In recent SEMs, angle discrimination is highlighted in addition to the energy discrimination of SE and BSE. In particular, since BSE has higher energy than SE, and it is less susceptible to an electric field from a specimen or a magnetic field of a primary beam, thus BSE reaches a detector while maintaining an angular distribution at the time of emission from the specimen. PTL 1 discloses an SEM that selectively detects electrons emitted in a specific direction by dividing a detector element axially symmetrically around the light axis of an electron beam or at different relative angles with respect to the light axis. Further, PTL 2 discloses a SEM including a detector with two stages in the light axis direction or detectors divided axially symmetrically about the light axis or at different relative angles with respect to the light axis. Furthermore, PTL 3 discloses a scanning electron microscope including a backscattered electron detector movable in the horizontal direction or the vertical direction.

CITATION LIST

Patent Literature

PTL 1: JP-A-2013-33671 (corresponding to U.S. Patent Application Publication No. US 2014/0175279)
PTL 2: Japanese Patent No. 5386596 (corresponding to U.S. Pat. No. 8,629,395)
PTL 3: JP-A-9-320504

SUMMARY OF INVENTION

Technical Problem

As disclosed in PTL 1 and 2, angle discrimination detection of electrons by dividing a detector element or arranging detector elements in two stages is a detection method suitable for acquiring specific information on a specimen. However, since the size or the position of a detector is decided at the design stage of a SEM, even though a proper discrimination angle varies according to the shape of the pattern, the detector is unable to cope with the change. Also, as illustrated in PTL 3, by configuring a detector to be movable, it is possible to change a discrimination angle to some extent, but it is not possible to adjust the size of a detection angle range. Therefore, it is difficult to select a discrimination angle range with high precision.

A charged particle beam device aiming at adjusting the discrimination angle range with high precision is suggested below.

Solution to Problem

According to an aspect of the present invention to achieve the above object, provided is a charged particle beam device including a scanning deflector for scanning charged particle beam emitted from a charged particle source on a specimen, the charged particle beam device including: a first detector for detecting charged particles acquired by scanning of the charged particle beam on a specimen; and a second detector placed between the first detector and the specimen and supported to be movable in a light axis direction of the charged particle beam.

Advantageous Effects of Invention

According to the above configuration, charged particles can be detected based on a highly precise angle discrimination.

BRIEF DESCRIPTION OF DRAWINGS

FIG. 1 is a diagram illustrating an outline of a scanning electron microscope.
FIG. 2 is a view of a YAG detector viewed from a direction orthogonal to a beam light axis.
FIG. 3 is a view of a detection surface of a YAG detector viewed from the beam light axis direction.
FIG. 4 is a diagram illustrating a reflector for converting electrons emitted from a specimen into secondary electrons and a detector for detecting the secondary electrons generated by the reflector.
FIG. 5 is a diagram illustrating an example of a scanning electron microscope equipped with a movable detector and a fixed detector.
FIG. 6 is a diagram illustrating an outline of a hole pattern.
FIG. 7 is a diagram illustrating an example of an image processing unit.
FIG. 8 is a diagram for describing a trajectory of electrons emitted from a specimen when an electron beam is irradiated on a region including a hole pattern.
FIG. 9 is a diagram illustrating a relationship between a detection amount and a detection angle of a BSE when an electron beam is irradiated on a region including a hole pattern.
FIG. 10 is a diagram illustrating an example of a position of a movable detector when a BSE is detected using a movable detector.
FIG. 11 is a diagram illustrating a relationship between a detection amount and a detection angle of a BSE when a difference occurs in the detection amount of BSE between different materials in a specific detection angle range.

FIG. 12 is a diagram illustrating an example of selectively detecting a BSE in a limited angular range by limiting arrival of the BSE of a specific angle to a fixed detector by using a movable detector.

FIG. 13 is a flowchart illustrating a process for optimizing the height of a movable detector.

FIG. 14 is a diagram illustrating an example of a SEM including a movable detector and a fixed detector above an objective lens.

DESCRIPTION OF EMBODIMENTS

The following description relates to a charged particle beam device capable of discriminating angles according to the shapes of a pattern during specimen observation.

The embodiment described below mainly describes a scanning electronic microscope including a charged particle source that emits a primary charged particle beam, a focusing lens (objective lens) that converges the primary charged particle beam emitted from the charged particle source onto a specimen, and detectors for detecting secondary charged particles emitted from an irradiation point on the specimen, in which the detectors are arranged in at least two stages in the direction of the primary charged particle beam, and respective detection signals are processed separately. Also, at least one detector is supported by a moving mechanism movable in the light axis direction.

BSE reflects the unevenness information of a specimen and information about the interior of the specimen depending on emission angles thereof. Therefore, by performing optimal angle discrimination, really necessary information about an observation target specimen can be visualized, and thus clarification of physical phenomena of the observation target specimen observed by a user and convenience are dramatically improved. According to the present invention, by moving a detector to process detection signals of an upper stage and a lower stage, angle discrimination of BSE can be performed according to the shape or the size of a specimen pattern.

Hereinafter, embodiments will be described with reference to the drawings. FIG. 1 is a diagram illustrating an outline of a scanning electron microscope.

A primary beam 2 (electron beam) emitted from an electron gun 1 by an extraction electrode (not illustrated) is accelerated by an acceleration electrode (not illustrated). Thereafter, the primary beam 2 is irradiated on a specimen 6 via a condenser lens 3, a diaphragm 4, or an objective lens 5. Depending on the energy at the time of irradiation, the composition of the specimen 6, the crystallinity, the potential of the specimen, the unevenness, the thickness of the specimen, the tilt angle of the specimen (the irradiation angle of the primary electron beam 2 to the specimen 6), or the like, emitted electrons 7 are emitted from the specimen 6.

The emitted electrons 7 are detected by a detector 8 (second detector) and a detector 9 (first detector) arranged coaxially with the light axis of the primary beam 2. Detected signal are converted into electric signals and input to a signal processing CPU 10. Within the signal processing CPU, each signal is subjected to an addition/subtraction process, and a result thereof is displayed as a SEM image on a GUI (not illustrated). Furthermore, a moving mechanism 11 is provided in the detector 8, and thus the detector 8 can be moved in the direction of the light axis of the primary beam 2. Although not illustrated here, required components of a SEM, such as an aligner used for adjusting the light axis of the primary electron beam 2, a deflection unit (scanning deflector) for scanning the primary electron beam 2 on the specimen 6, an image shifting unit for shifting the center position of the primary electron beam on the specimen 6, and a stigma unit for correcting astigmatism, are all included in the SEM column.

First Embodiment

Hereinafter, a scanning electron microscope including two detectors and at least one of the two detectors being a movable detector will be described. The two detectors have openings for transmitting the primary beam 2 therethrough, and at least one detector is provided with a moving mechanism for moving the detector in the direction of the light axis of a beam. First, the outline of the detector will be described. In the device according to the present embodiment, for example, a detector that converts into light via a scintillator and further converts the same into an electric signal, such as an Everhart-Thornley (ET) detector, a Robinson detector or a YAG detector, a semiconductor detector, a microchannel plate (MCP), or an electron multiplier tube is used.

An embodiment with a YAG detector will be described. FIG. 2 illustrates the detection principle of a YAG detector. When a BSE 12 emitted from the specimen 6 hits a YAG detector 13, m photons 14 are generated per electron depending on the energy thereof. The generated photons pass through a light guide 15 and are converted into electrons at a photoelectric surface 17 of a photomultiplier tube 16. Electrons 18 are amplified in the photomultiplier tube, and a signal is extracted as a current in a preamplifier 19.

FIG. 3 illustrates the shape of a YAG detector. A YAG detector is formed axially symmetrical with respect to the light axis of the primary electron beam. Although the outer diameter of a YAG detector is not particularly limited, the diameter is desired to be 50 mmφ or less in order to avoid interference with a structure in a specimen chamber. Also, at the center of the detectors 8 and 9, circular holes through which the primary electron beam passes are provided, and the diameter of the holes is from about 1 to 5 mmφ. Also, as illustrated in FIG. 4, instead of directly detecting electrons emitted from a specimen, the electrons emitted from the specimen may be indirectly detected by using a combination of a reflector 20 for generating secondary electrons 22 by the collision of the electrons emitted from the specimen, and the detection part 21. The secondary electrons 22 generated by the reflector 20 are accelerated toward a scintillator 23 by a lead-in electrode to which a voltage of about 10 kV is applied, thereby generating light.

Next, the moving mechanism will be described. FIG. 5 illustrates an example in which the detector 8 and the detector 9 are arranged between the objective lens 5 and the specimen 6. Furthermore, a detection unit including the detector 8, the light guide 15, and the photomultiplier tube 16 is supported by the moving mechanism 11.

The moving mechanism 11 is, for example, a cross roller stage having a V groove. When a user presses a button on a GUI, a knob 24 provided outside the vacuum rotates and a stage moves. The specification of the moving mechanism includes, for example, a moving amount from 0 to 5 mm, a knob one-turn of 0.5 mm, a sensitivity of 0.003 mm, and a load carrying capacity of 1.5 kg. However, the moving mechanism is not limited thereto, and it is also possible to combine the above-described moving mechanism with a high-precision moving mechanism using a driving mechanism such as a piezo element, and the knob 24 can be manually operated. A support member supporting the detector 8 includes the light guide 15. As illustrated in FIG. 5, by supporting the detector 8 so as to suspend the detector 8 by a supporting member passing through the electron beam opening of the detector 9, the detector 8 can be moved without arranging the supporting member of the detector 8 between the detection surface of the detector 9 and the specimen.

A method of setting device conditions according to the type of a specimen for observation will be described below. FIG. 6 is a diagram illustrating an example of a deep hole pattern. A hole 26 is formed in a specimen surface layer 25, and a material constituting the specimen surface layer 25 is silicon. Tungsten 27 is provided at the bottom of the hole 26. When the amounts of BSEs emitted from tungsten and silicon are compared with each other, the emission amount of BSEs from tungsten is larger than silicon due to the difference in atomic number. Considering only the emission amount of BSEs, tungsten has to be brighter than silicon. However, in reality, as illustrated in FIG. 8, electrons 29 emitted at a low angle with respect to a specimen surface can be guided toward a detector without colliding with obstacles as long as the electrons 29 are emitted from the specimen surface. However, since electrons emitted from the bottom of the hole collide with the sidewall of the hole 26, the electrons cannot escape to the specimen surface, and thus the electrons cannot be detected. As a result, the amount of detectable signals decreases even for a material exhibiting a relatively large emission amount of BSEs as compared to the material constituting the specimen surface. On the other hand, electrons 28 emitted at a high angle can escape to the specimen surface without colliding with the sidewall of the hole 26, even if the electrons are emitted from the bottom of the hole 26 (tungsten 27). Therefore, if high-angle electrons can be selectively detected, an image emphasizing the bottom of the hole 26 can be formed. Although BSEs are emitted from the specimen surface at a high angle, by restricting the arrival of low angle electrons to the detector, an image more emphasizing the bottom of the hole 26 can be acquired as compared to the case where the arrival of low angle electrons is not restricted.

FIG. 9 is a diagram illustrating a relationship between the emission angle of BSE and the emitted amount of BSE. In FIG. 9, the angle of 0 degree corresponds to the beam light axis direction. Data 901 illustrates the change in the signal amount of high angle BSEs (a relative angle from the beam light axis is small and a relative angle from the specimen surface is large), and data 902 illustrates the change in the signal amount of low angle BSEs. If the detector 8 illustrated in FIG. 10 can be moved to selectively detect high angle electrons (for example, selective detection of BSE of angles from 0 to 10° close to the light axis), observation using an image emphasizing the bottom of a hole can be performed. However, since the optimal acquisition angle varies depending on a hole diameter 30 or a hole depth, it is important to move the detector 8 up and down to make an appropriate angle discrimination.

Furthermore, as illustrated in FIG. 10, it is possible to be configured to provide the movable detector 8 and the fixed detector 9 to enable adjustment of an angular range of BSEs arriving at the fixed detector 9 by moving the movable detector 8. As a result, BSEs in a specific angular range can be detected by using the fixed detector 9. The fixed detector 9 has a larger detection surface and a larger diameter than the movable detector 8 so as to enable detection of BSEs in a larger emission angular range than the movable detector 8.

For example, by moving the movable detector 8 illustrated in FIG. 10 within a range such that the detector 8 can be positioned on a virtual straight line connecting an electron beam irradiation point on the specimen (the point where the specimen and the beam light axis intersect) and the detection surface of the fixed detector 9, the size of a detection angular range of BSEs can be adjusted. More specifically, by using the movable detector 8 to partially restrict the arrival range of BSEs to the fixed detector 9 and to enable adjustment of the range, the size of an angular range can be adjusted, and thus BSEs of a particular angle can be selectively detected.

According to the device illustrated in FIG. 10, by moving the movable detector 8 downward, the reaching angular range of high angle BSEs to the fixed detector 9 can be restricted, and thus the restricted angular range can be adjusted. According to such a configuration, an image formation can be performed through proper blocking of high angle BSEs in particular.

FIG. 11 is a diagram illustrating a relationship between the emission angle and the emission amount of BSEs when a certain specimen is irradiated with an electron beam. FIG. 11 illustrates a state in which the emission angle and the emission amount of a signal 1101 emitted from a certain portion A on a specimen are similar to those of a signal 1102 emitted from a certain portion B. In order to clarify the luminance difference (contrast) between the portion A and the portion B, selective detection of BSE in an angular region where there is a certain degree of signal difference between the portion A and the portion B can be considered. As can be seen from FIG. 11, there is a signal difference between the portion A and the portion B within the emission angular range from 30 to 70°. Therefore, the contrast between the portion A and the portion B can be maximized by selectively detecting BSEs in the emission angular range from 30 to 70° and restricting BSEs of other angles from reaching the detector.

In the present embodiment, in order to selectively detect BSEs from 30 to 70°, as illustrated in FIG. 12, the detector 8 is moved downward toward the specimen to use the detector 8 as a shielding member for restricting arrival of BSEs from 0 to 30° to the detector 9. By such an adjustment, a device condition suitable for observation of the specimen with contrast can be set through selective detection of BSE of relatively low angles. The relationship between the amount of movement and the acquisition angle depends on the size of the detector or a distance between the detector and the specimen. In the case of the device illustrated in FIG. 12, the acquisition angle was changed by about 10° due to a change of the height of the detector 8 by 1 mm.

As a method for angle discrimination of BSE, discrimination angles may be adjusted by moving one detector in the light axis direction. However, in this case, it is difficult to perform selective detection of BSE of relatively low angles as illustrated in FIG. 12. Also, angle discrimination may be performed by splitting a detector concentrically. However, since the shape and the acquisition angle of a detector are decided at the design stage of the detector, even though the proper discrimination angle is different therefrom, the detector cannot cope with the change. Furthermore, in case of splitting a detector, the detection efficiency at junctions of the detector becomes almost 0, and thus the detector does not function as a detector.

As described above, by arranging detectors in two or more stages and moving at least one of the detectors, acquisition angle of BSE can be freely changed according to the specimen for observation.

FIG. 13 is a flowchart illustrating a process for setting an optimal height of a detector. First, an SEM image is generated based on electrons obtained by scanning an electron beam to a specimen. From the SEM image of the observation target specimen, an operator marks points to measure BSE amount (brightness) (step 1301). Next, the operator presses the 'detector automatic setting button' on a GUI displayed on a display device together with the SEM image (step 1302). Then, the detector in the SEM is set to a start position, and then starts moving (step 1303). While moving the detector, the brightness of the marked points are measured (step 1304). At each height position, BSE detection is performed by using the detector 9 to form an image. At the same time, the luminance of the marked point at each height position is stored in a predetermined storage medium. In an operation processor (not illustrated) provided in the SEM, the brightness is divided into, for example, 256 grayscales from the maximum value and the minimum value of measurement results, and, as illustrated in FIGS. 9 and 11, a graph with the horizontal axis indicating angles and the vertical axis indicating BSE amounts is displayed on the GUI (step 1305).

The operator determines an optimal acquisition angle from the graph displayed on the GUI and selects the optimal acquisition angle (step 1306). The device sets the height of the detector in correspondence to the selected optimal acquisition angle (step 1307). The size relationship between the upper stage and the lower stage of detectors or the movable detector are not limited to those described above.

In the flowchart of FIG. 13, the example in which the operator marks points to evaluate brightness on the SEM image has been described. However, it may be configured to automatically control the scanning electron microscope so as to satisfy a predetermined condition. For example, a control device (operation processing device) for controlling the scanning electron microscope may perform image evaluation based on the predetermined condition to automatically set an appropriate height of the detector.

Furthermore, as illustrated in FIG. 14, the same effect can be obtained not only by arranging the detector between the objective lens and the specimen, but also arranging the detector above the objective lens. In the example of FIG. 14, a movable detector 1401 supported by the moving mechanism 11 is arranged above the objective lens 5 (closer to the electron source than to the objective lens 5), and furthermore, a fixed detector 1402 is arranged closer to the electron source than the movable detector 1401. As in the previously described embodiment, depending on the position of the movable detector 1401, the angular range of BSE incident to the fixed detector 1402 can be adjusted.

By moving the movable detector 1401, the incident angular range (size) to the fixed detector 1402 can be adjusted, and thus it is possible to set an appropriate discrimination angle according to the shape and composition of the specimen or a combination thereof. Furthermore, even if the position of the movable detector is changed, the total amount of BSE incident to the movable detector and the fixed detector does not change, and thus appropriate angle discrimination can be performed while maintaining the detection efficiency. Image generation based on an output of the fixed detector and image generation based on a combined output of the fixed detector and the movable detector are performed to obtain both an image giving priority to the detection efficiency and an image generated based on an angle discrimination corresponding to the observation purpose.

FIG. 7 is a diagram illustrating an example of an image processing unit 701 that generates an image based on outputs of the fixed detector and the movable detector. To the image processing unit 701, a terminal 702 including a display device for displaying a GUI screen or a SEM image, an input device for inputting a device condition and the like are connected. The image processing unit 702 includes an operation processor 703 that executes image processing and the like according to a predetermined program, and a memory 704 that stores images generated based on necessary programs and signal acquisition. In an image generating unit of the operation processor 703, an image is generated under the condition based on an instruction from the terminal 702. In the image generating unit, an image synchronized with a scanning signal can be generated based on a fixed detector output, a movable detector output, and a combined output of the fixed detector output and the movable detector. Furthermore, an image evaluation portion setting unit sets portions within image to perform signal amount evaluation based on the input of the terminal 702. For example, in order to emphasize a certain portion on the specimen, a Region Of Interest (ROI) is set to the portion. Furthermore, in order to emphasize the contrast between portions A and B of the image, two ROIs may be set. The image evaluation unit evaluates images of the selected portions based on the set ROI or signal waveforms.

The device condition setting unit specifies a position of the movable detector satisfying a predetermined condition. For example, when it is desired to emphasize the portion A with respect to the portion B, a detector position at which the luminance difference between the portions A and B becomes maximum is selected. Furthermore, a detector position at which the luminance difference with respect to a baseline (background) of a particular portion is maximized may be selected. Furthermore, when there is no desired observation target pattern in an initial image (invisible) and a desired observation target pattern becomes visible if the luminance of a certain material is lowered, a position at which a signal amount needs to be reduced may be selected as an ROI, and a detector position at which the corresponding ROI exhibits the lowest signal amount and a signal amount in the field of view is equal to or greater than a predetermined amount may be selected.

By providing a scanning electron microscope capable of adjusting the range of incident angles of signals to the other detector by moving one detector, the size of an angular discrimination range can be adjusted.

REFERENCE SIGNS LIST

1: electron source
2: primary beam
3: condenser lens
4: diaphragm
5: objective lens
6: specimen
7: emitted electron
8: first detector
9: second detector
10: signal processing CPU
11: moving mechanism
12: BSE
13: YAG detector
14: photon
15: light guide
16: photomultiplier tube
17: photoelectric surface
18: electron
19: preamplifier
20: reflector
21: detection part 22: secondary electrons
23: scintillator
24: knob
25: surface layer
26: hole
27: tungsten
28: electrons emitted at high angle
29: electrons emitted at low angle
30: hole diameter

The invention claimed is:

1. A charged particle beam device provided with a scanning deflector for scanning a charged particle beam emitted from a charged particle source on a specimen, the charged particle beam device comprising:
   a first detector for detecting charged particles acquired by scanning the charged article beam on the specimen;
   a second detector provided between the first detector and the specimen, and supported to be movable in an axis of the charged particle beam; and
   a moving mechanism for moving the second detector along the axis of the charged particle beam, wherein
   the moving mechanism includes a supporting member for supporting the second detector through an opening formed in the first detector for passing the charged particle beam therethrough; and a driving mechanism for moving the supporting member in the axis direction of the charged particle beam.

2. The charged particle beam device according to claim 1, wherein
   the supporting member includes a light guide.

3. A charged particle beam device provided with a scanning deflector for scanning a charged particle beam emitted from a charged particle source on a specimen, the charged particle beam device comprising:
   first and second detectors each having an opening for transmitting the charged particle beam therethrough, and configured to detect backscattered electrons acquired by scanning of the charged particle beam on the specimen,
   wherein the second detector is placed between the first detector and the specimen and supported to be movable in an axis direction of the charged particle beam.

4. The charged particle beam device according to claim 3, wherein
   the second detector has a moving range including a position where a detection surface thereof is positioned on a virtual straight line between an irradiation position of the charged particle beam on the specimen and a detection surface of the first detector.

5. The charged particle beam device according to claim 3, wherein
   the second detector has a moving range including a position at which passage of charged particles emitted from the specimen toward the first detector is blocked.

6. The charged particle beam device according to claim 3, wherein
   the first detector has a larger detection surface than the second detector.

7. The charged particle beam device according to claim 3, wherein the first and second detectors are formed symmetrically with respect to the axis of the charged particle beam.

8. The charged particle beam device according to claim 3, further comprising:
   an objective lens that converges the charged particle beam onto the specimen,
   wherein the first and second detectors are disposed between the charged particle source and the objective lens.

9. The charged particle beam device according to claim 3, further comprising:
   a user interface for indicating a marking point for scanning the charged particle beam using an image of the specimen obtained by the charged particle beam device; and
   an image processor for generating an image based on the backscattered electrons obtained by scanning the charged particle beam on a region of the specimen corresponding to the marking point.

10. The charged particle beam device according to claim 9, further comprising an operation processor that outputs, at plural different positions of the second detector, values of brightness of the backscattered electrons detected by the first detector.

* * * * *